United States Patent [19]
Fukada et al.

[11] Patent Number: 5,643,803
[45] Date of Patent: Jul. 1, 1997

[54] PRODUCTION METHOD OF A SEMICONDUCTOR DYNAMIC SENSOR

[75] Inventors: Tsuyoshi Fukada, Aichi-gun; Yoshimi Yoshino, Inuyama; Hiroshige Sugito, Nagoya; Minekazu Sakai, Nukata-gun, all of Japan

[73] Assignee: Nippondenso Co., Ltd., Kariya, Japan

[21] Appl. No.: 122,164

[22] Filed: Sep. 17, 1993

[30] Foreign Application Priority Data

Sep. 18, 1992 [JP] Japan ................................. 4-249352
Sep. 21, 1992 [JP] Japan ................................. 4-251455
Mar. 10, 1993 [JP] Japan ................................. 5-048853

[51] Int. Cl.$^6$ .................................................. C25F 3/12
[52] U.S. Cl. ........................... 437/15; 437/901; 437/921; 205/656
[58] Field of Search ................... 204/129.3, 228; 437/15, 901, 921; 205/656

[56] References Cited

U.S. PATENT DOCUMENTS

| | | | |
|---|---|---|---|
| 4,054,497 | 10/1977 | Marshall | 204/129.65 |
| 4,664,762 | 5/1987 | Hirata | 204/129.3 |
| 4,995,953 | 2/1991 | Yee . | |
| 5,167,778 | 12/1992 | Kaneko et al. . | |

FOREIGN PATENT DOCUMENTS

| | | |
|---|---|---|
| 59-13377 | 1/1984 | Japan . |
| 61-30038 | 2/1986 | Japan . |
| 62-61374 | 3/1987 | Japan . |
| 63-292071 | 11/1988 | Japan . |
| 4239183 | 8/1992 | Japan . |
| 566728 | 9/1993 | Japan . |

OTHER PUBLICATIONS

Kloeck et al: "Study of Electrochemical Etch–Stop for High–Precision Thickness Control of Silicon Membranes" IEEE Transactions on Electron Devices, vol. 36, No. 4, Apr. 1989, pp. 663–669.

Sarro et al: "Silicon Cantilever Beams Fabricated by Electrochemically Controlled Etching for Sensor Applications", Journal of the Electochemical Society, vol. 133, No. 8, Aug. 1986, pp. 1724–1729.

Kim et al: "Temperature Sensitivity in Silicon Piezoresistive Pressure Transducers", IEEE Transactions on Electron Devices, vol. ED–30, No. 7, Jul. 1983, pp. 802–810.

Patent Abstracts of Japan, vol. 011, No. 249, (E–532) Aug. 13, 1987, & JP–A–62 061 374, Mar. 18, 1987.

S.M. Sze, *Physics of Semiconductor Devices*, John Wiley & Sons, Inc. (1981) pp. 74–79.

IEEE Electron Device Letters, vol. EDL–2, No. 2 Feb. 1981 pp. 44–45 An Electrochemical P.N Junction Etch–Stop for the formation of silicon Microstructures, T.N. Jackson et al. Electrochemically controlled Thinning of Silicon, by H.a. Waggener (Manuscript received Dec. 31, 1969) pp. 472–475.

*Primary Examiner*—John Niebling
*Assistant Examiner*—Brendan Mee
*Attorney, Agent, or Firm*—Cushman, Darby & Cushman IP Group of Pillsbury Madison & Sutro LLP

[57] ABSTRACT

It is intended to provide an etching method for semiconductor devices in which the etching depth or the thickness of a thin thickness portion can be precisely controlled. According to experiment results, when a P-type substrate in which an N-type epitaxial layer is formed is immersed in an etching solution such as KOH or the like, and a voltage for reverse bias of PN junction is applied between an electrode plate opposing the substrate and the epitaxial layer to perform electrochemical etching, it has been found that the distance from the PN junction plane to the etching stop position is approximately equal to a depletion layer width at the substrate side of the PN junction portion. Namely, the etching stops at the forward end of the depletion layer. Therefore, the junction depletion layer width at the substrate side is controlled to be a size obtained by subtracting a necessary depth for etching from a thickness of the semiconductor substrate except for the semiconductor layer, so that the etching depth or the thickness of the thin thickness portion remaining after etching can be precisely controlled.

15 Claims, 11 Drawing Sheets

PRODUCTION METHOD OF A SEMICONDUCTOR DYNAMIC SENSOR

BACKGROUND OF THE INVENTION

1. Field of the Invention

The present invention relates to a semiconductor dynamic sensor having a thin thickness structure such as a semiconductor acceleration sensor, a semiconductor pressure sensor or the like. In addition, it relates to a production method thereof.

2. Description of the Related Art

The conventional semiconductor dynamic sensor has a thin thickness structure in its interior, wherein distortion is generated by allowing a dynamic quantity such as acceleration, pressure or the like to act on this thin thickness structure, and the distortion is electrically detected according to a piezoresistance change, a capacitance change or the like.

As an effective production method for the thin thickness structure which serves as a distortion-causing portion, for example, an electrochemical etching method proposed by an official gazette of Japanese Patent Laid-open No. 62-61374 and the like is known.

Namely, the official gazette of Japanese Patent Laid-open No. 62-61374 discloses an electrochemical etching method for silicon substrates in which a P-type substrate having an N-type layer is immersed in an etching solution to oppose an electrode plate, a voltage is applied between the N-type layer and the electrode plate to perform anisotropic etching of the P-type substrate, and a distortion-causing portion and a separation groove of a semiconductor dynamic sensor are formed.

In addition, the above-mentioned official gazette discloses the fact that the etching automatically stops when it arrives at the N-type layer.

SUMMARY OF THE INVENTION

The present invention relates to improvement in the formation of the thin thickness portion of the semiconductor dynamic sensor in which the electrochemical etching method is used, an object of which is to provide a production method for semiconductor dynamic sensors in which the thickness of the thin thickness portion can be precisely controlled.

According to experiments and consideration by the present inventors, it has been revealed for the first time that the etching stop position in the above-mentioned electrochemical etching terminates at the P-type substrate side as the material subjected to the etching rather than at the PN junction plane at which the etching has been considered to stop. Moreover, it has been found that the distance from the PN junction plane to the etching termination position varies depending on each impurity concentration of the N-type layer and the P-type substrate and the change in the application voltage.

Therefore, for example, the thickness of the distortion-causing portion (for example, a diaphragm portion) of the semiconductor dynamic sensor has been hitherto set in accordance with the thickness of the N-type layer, however, an actual thickness of the distortion-causing portion becomes not less than the above, and consequently an actually obtained distortion amount of the distortion-causing portion is smaller than a theoretically calculated value, which results in decrease in the designed accuracy of the sensor.

This fact may cause further problems when the distortion-causing portion is made to have a marked thin thickness as compared with those in the prior art in accordance with the demand for increasing the sensitivity of the sensor. Namely, in the prior art, the thickness of the distortion-causing portion to be made to have the thin thickness by the above-mentioned etching is, for example, several 10 μm which is relatively thick, so that even when the thickness of the distortion-causing portion disperses due to the dispersion in the etching termination position, the influence on the sensor sensitivity thereby has been small. However, when it is intended to obtain high sensitivity by allowing the distortion-causing portion to have a thin thickness such as for example several μm, the above-mentioned dispersion causes large dispersion in the sensitivity.

In the invention of the present application, the cause of the variation has been discovered for the first time, and on the basis of the knowledge obtained therefrom, the etching stop position in the electrochemical etching is precisely predicted, so as to minutely control the thickness of the distortion-causing portion.

Namely, the present invention lies in a production method for semiconductor dynamic sensors wherein a semiconductor member in which a first conductive type semiconductor portion and a second conductive type semiconductor portion form a PN junction is immersed in an etching solution to allow said second conductive type semiconductor portion to oppose an electrode, a voltage is applied between said first conductive type semiconductor portion and said electrode, and said second conductive type semiconductor portion is subjected to electrochemical etching so as to form a thin thickness shaped distortion-causing portion, characterized in that the thickness of said distortion-causing portion is set to be a thickness in which in addition to a thickness of said first conductive type semiconductor portion, a width of a depletion layer, which extends from said PN junction to the side of said second conductive type semiconductor portion during said electrochemical etching, is estimated.

Concretely, there are provided following steps:

a step of preparing a wafer in which a monocrystal semiconductor layer of the first conductive type of a predetermined thickness is formed on a monocrystal semiconductor substrate of the second conductive type;

a step of forming a semiconductor distortion detecting means in the monocrystal semiconductor layer;

a step of forming a thin thickness portion having a thickness T by immersing the wafer in an etching solution to oppose said monocrystal semiconductor substrate of the second conductive type to an electrode, and applying a voltage between said monocrystal semiconductor layer of the first conductive type and said electrode to perform electrochemical etching of said monocrystal semiconductor substrate of the second conductive type; and a step of setting said predetermined thickness W of said monocrystal semiconductor layer of the first conductive type using $$W = T - (2K\xi Vt/(qNb(1+Nb/Ne)))^{1/2}$$

provided that the dielectric constant of the monocrystal semiconductor is $K$, the vacuum dielectric constant is $\xi$, the sum of said application voltage during the electrochemical etching and the barrier voltage at 0 bias is $Vt$, the electric charge amount of electron is $q$, the impurity concentration of said semiconductor substrate is $Nb$, and the impurity concentration in said semiconductor layer is $Ne$.

According to experiment results by the present inventors, it has been found that the distance from the PN junction plane to the etching stop position is approximately equal to the depletion layer width of the second conductive type semiconductor portion (semiconductor portion at the side subjected to etching) of the PN junction portion. Namely, the etching terminates at the forward end of the depletion layer.

Therefore, in the present invention, with respect to the thickness of the distortion-causing portion, the setting is made such that in addition to the thickness of the above-mentioned first conductive type semiconductor portion, the depletion layer width, which extends from the above-mentioned PN junction to the side of the second conductive type semiconductor portion during the electrochemical etching, is estimated, so that it is possible to precisely control the thickness of the thin thickness shaped distortion-causing portion.

DESCRIPTION OF THE PREFERRED EMBODIMENTS

Figure 1:
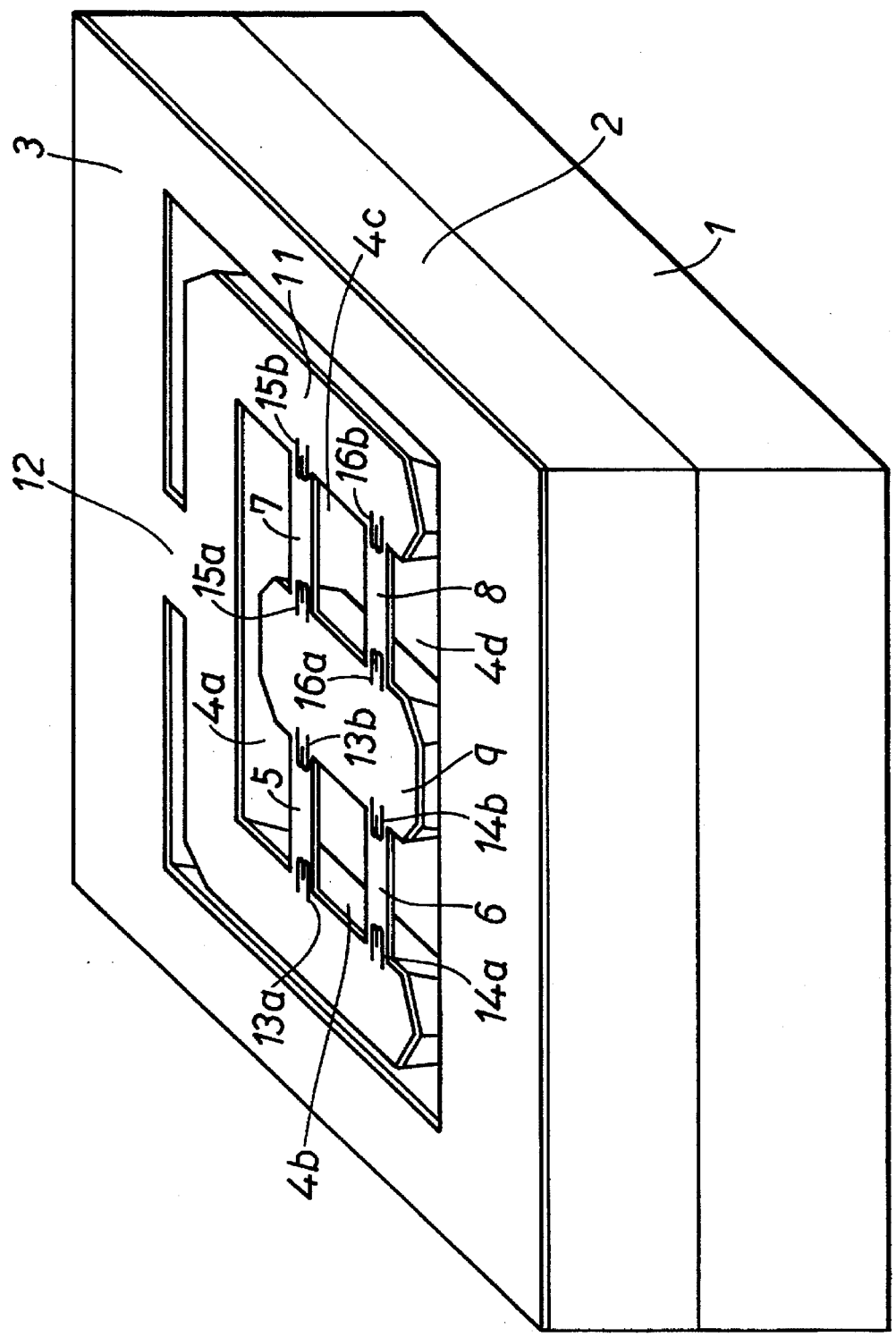
FIG. 1 is a perspective view of a semiconductor acceleration sensor chip in which the first example of the present invention is applied.

The present invention will be explained hereinafter on the basis of examples shown in the drawings.

FIRST EXAMPLE

One example of the semiconductor acceleration sensor in which this invention is applied will be explained hereinafter in accordance with the drawings.

Figure 2:
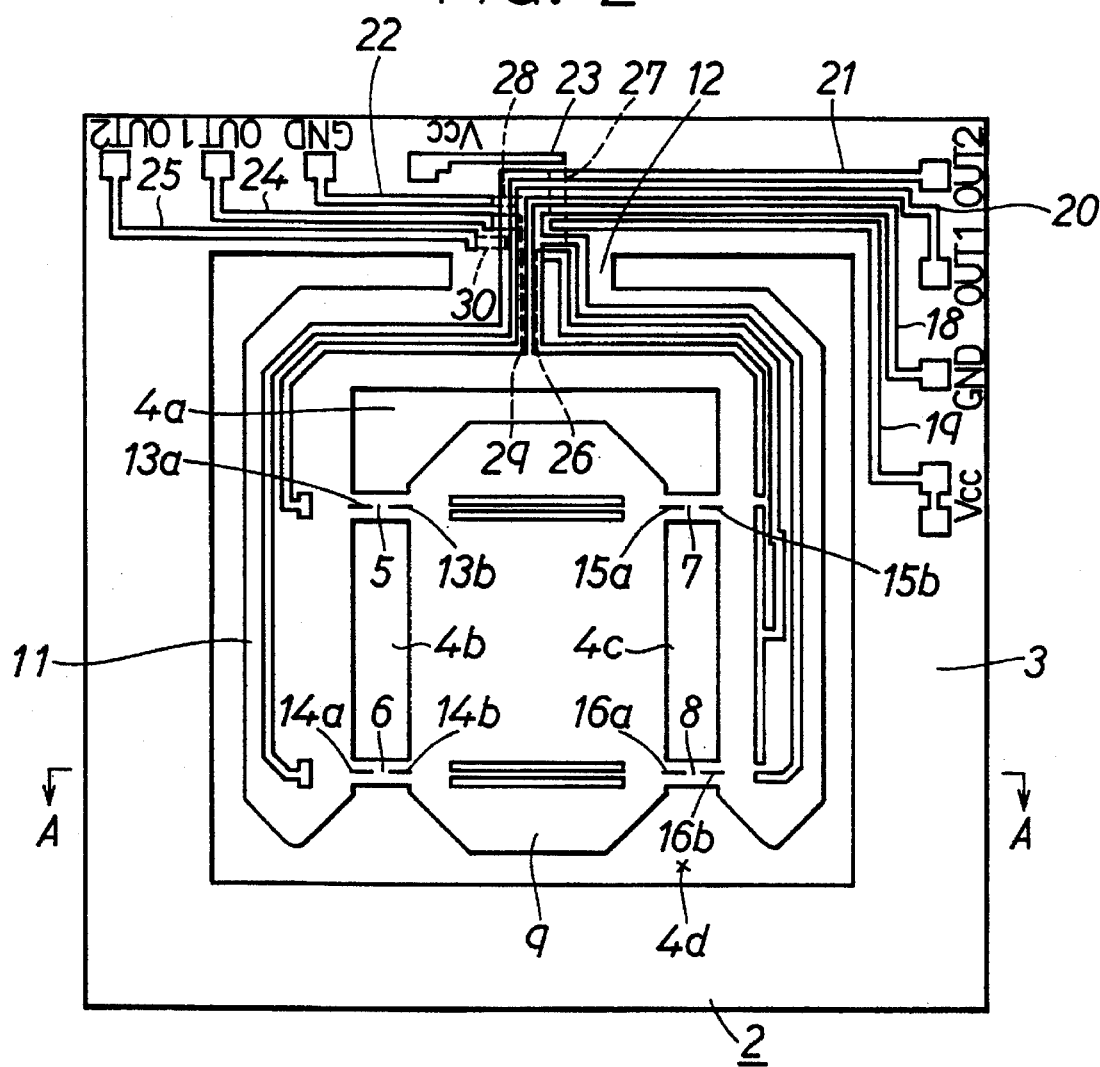
FIG. 2 is a plan view of the sensor chip in FIG. 1.
Figure 3:
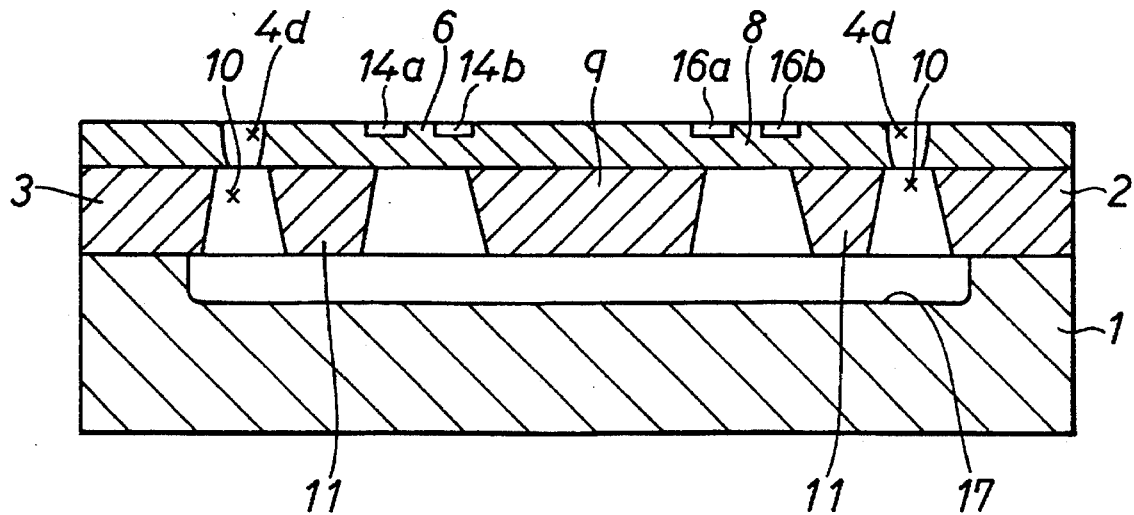
FIG. 3 is a cross-sectional view taken along A—A in FIG. 2.

FIG. 1 shows a perspective view of this semiconductor acceleration sensor, FIG. 2 shows a plan view of the semiconductor acceleration sensor, and FIG. 3 shows a cross-section taken along A—A in FIG. 2. The present sensor is used for the ABS system of automobiles.

A silicon chip 2 having a rectangular plate shape is joined on a pedestal 1 having a rectangular plate shape composed of Pyrex glass. The silicon chip 2 has a first support portion 3 of a rectangular frame shape with its back main face which joins to the pedestal 1, and the first support portion 3 is formed with four sides of the silicon chip 2. At the inside of the first support portion 3 of the silicon chip 2 are provided upper separation grooves 4a, 4b, 4c, 4d and a lower separation grooves 10 in concave shapes, and the upper separation grooves 4a, 4b, 4c, 4d and the lower separation grooves 10 are communicated to form a penetrating groove which penetrates through the chip 2. The C-shaped upper separation grooves 4d formed at the inside of the rectangular frame shaped first support portion 3 and the lower separation grooves 10 under the upper separation groove 4d are used to partition and form a second support portion 11 having a thick thickness ]-shape and a thick thickness connecting portion 12, and the second support portion 11 is connected with the first support portion 3 by the connecting portion 12. Further, thin thickness distortion-causing portions 5, 6, 7, 8 having a thin thickness are provided to extend from the inner side face of the second support portion 11, and with the forward ends of the thin thickness distortion-causing portions 5, 6, 7, 8 is connected a weight portion 9 having a thick thickness rectangular shape.

Namely, the second support portion 11 is connected through the connecting portion 12 with the thick thickness first support portion 3 which joins to the pedestal 1, and the weight portion 9 is supported at both ends through the thin thickness distortion-causing portions 5–8 from the second support portions 11. The lower separation grooves 10 are formed below the upper separation grooves 4a, 4b, 4c, 4d and the thin thickness distortion-causing portions 5–8, and the upper separation grooves 4a, 4b, 4c, 4d communicate with the lower separation grooves 10 to form the penetrating groove which penetrates through the chip 2.

Piezoresistance regions 13a, 13b, 14a, 14b, 15a, 15b, 16a, 16b are formed on surface portions of the thin thickness distortion-causing portions 5–8 as two individuals for each. Further, as shown in FIG. 3, a concave portion 17 is formed at the central portion of the upper face of the pedestal 1, so as not to make contact when the weight portion 9 is displaced upon the application of acceleration.

An aluminum wiring arrangement pattern on the surface of the silicon chip 2 is shown in FIG. 2.

There are arranged a wiring arrangement 18 for grounding, a wiring arrangement 19 for applying a power source voltage Vcc, and wiring arrangements 20, 21 for output for taking out an electric potential difference corresponding to acceleration. In addition, another set of four types of wiring arrangements are prepared with respect to these wiring arrangements. Namely, there are formed a wiring arrangement 22 for grounding, a wiring arrangement 23 for applying the power source voltage, and wiring arrangements 24, 25 for output for taking out an electric potential difference corresponding to acceleration. At a halfway portion of the wiring arrangement 19 for applying the power source voltage is interposed an impurity diffusion layer 26 of the silicon chip 2, and the wiring arrangement 18 for grounding crosses over the impurity diffusion layer 26 through a silicon oxide film. In the same manner, the wiring arrangement 23 for applying the power source voltage is connected to the wiring arrangement 19 for applying the power source voltage through an impurity diffusion layer 27, the wiring arrangement 22 for grounding is connected to the wiring arrangement 18 for grounding through an impurity diffusion layer 28, and the wiring arrangement 24 for output is connected to the wiring arrangement 20 for output through an impurity diffusion layer 29. In addition, the wiring arrangements 21 and 25 for output are connected through an impurity diffusion layer 30 for resistance adjustment. In addition, in the present example, wiring connection is made using the wiring arrangements 18–21.

Figure 4:
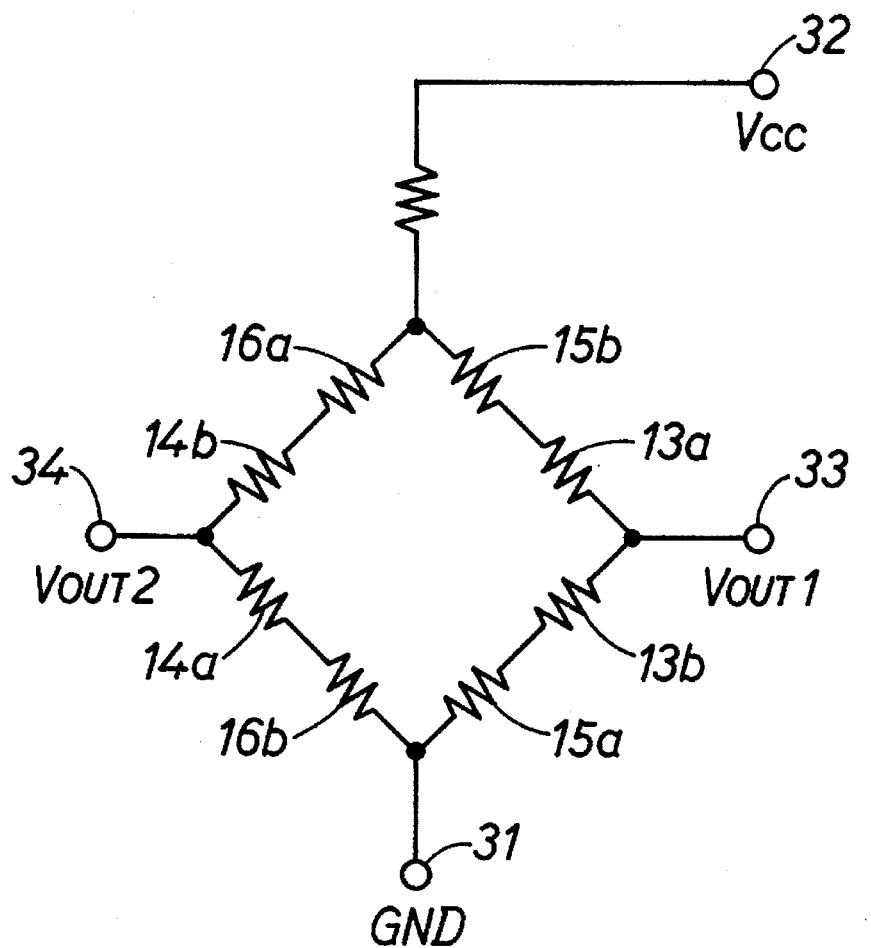
FIG. 4 is a figure of a bridge circuit of this sensor.

Each of the piezoresistance regions 13a, 13b, 14a, 14b, 15a, 15b, 16a, 16b forms a Wheatstone bridge circuit as shown in FIG. 4, wherein a terminal 31 is a terminal for grounding, a terminal 32 is a terminal for applying the power source voltage, and terminals 33 and 34 are output terminals for taking out the electric potential difference depending on acceleration.

Next, a production method for this sensor will be explained on the basis of FIG. 5 to FIG. 9. Incidentally, FIG. 5 to FIG. 9 show cross-sections taken along A—A in FIG. 2.

Figure 5:
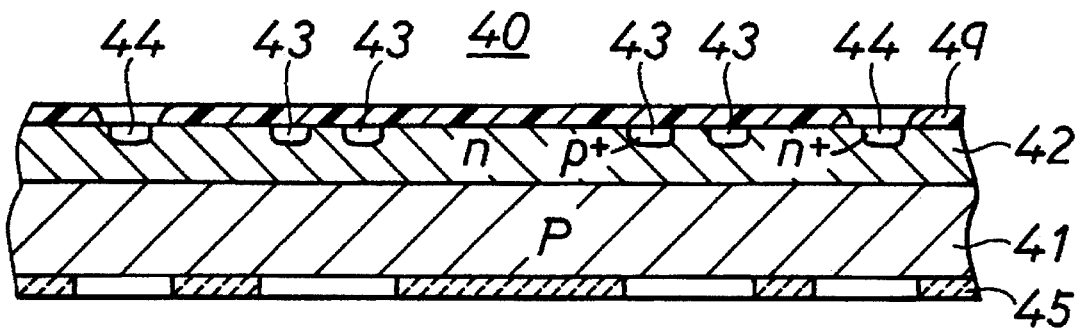
FIG. 5 to FIG. 9 are cross-sectional views showing production steps of the sensor chip in FIG. 1, FIG. 10 and FIG. 11 are figures showing an electrochemical etching method.

At first, as shown in FIG. 5, a wafer (the semiconductor member as referred to in the present invention) 40, which has an n-type epitaxial layer (the first conductive type semiconductor portion as referred to in the present invention) 42 on a p-type substrate (the second conductive type semiconductor portion as referred to in the present invention) 41 having a plane azimuth of (100), is prepared, P$^+$ diffusion layers 43 are formed as the piezoresistance regions 13a, 13b, 14a, 14b, 15a, 15b, 16a, 16b, n$^+$ diffusion layers 44 are formed at surface portions of planned regions in which the upper separation grooves 4a, 4b, 4c, 4d are etched as electrode contacts during electrochemical etching, and an n$^+$ diffusion layer (not shown) for electric potential fixation for fixing the electric potential of the epitaxial layer 42 is formed at a surface portion of a region not subjected to the above-mentioned etching of the epitaxial layer 42.

Thereafter a silicon oxide film (not shown) formed on the epitaxial layer 42 is selectively opened, on which the aluminum wiring arrangements 18–25 (see FIG. 2, but illustration is omitted in FIG. 5 to FIG. 8) are formed.

In addition, the aluminum wiring arrangements 18–25 are contacted at predetermined positions of the p$^+$ diffusion layer 43, thereafter a passivation insulation film (not shown) comprising a silicon oxide film or the like is accumulated, the passivation insulation film is selectively opened to form a contact hole for wire bonding, and subsequently the passivation insulation film is opened to provide an aluminum contact portion (not shown) for current application which contacts with the n$^+$ diffusion layer 44.

Next, a plasma nitride film (P-SiN) 45 is formed on the surface (back main face) of the substrate 41 except for the etching planned region for the lower separation grooves 10, and a resist film which is not illustrated (not shown) is used to perform photo-patterning of the plasma nitride film 45.

Next, a resist film 49 is applied by spinning on the front main face of the wafer 40, that is the surface of the epitaxial layer 42 to serve as the etching planned regions for the upper separation grooves 4a, 4b, 4c, 4d, so as to perform photo-patterning. Incidentally, the above-mentioned silicon oxide film and the passivation insulation film on the etching planned regions for the upper separation grooves 4a, 4b, 4c, 4d are removed beforehand, and the above-mentioned aluminum contact portion is exposed at the surface of the epitaxial layer 42 exposed due to the photo-patterning of the resist film 49. Incidentally, the resist film 49 is a PIQ (polyimide) film.

Figure 6:
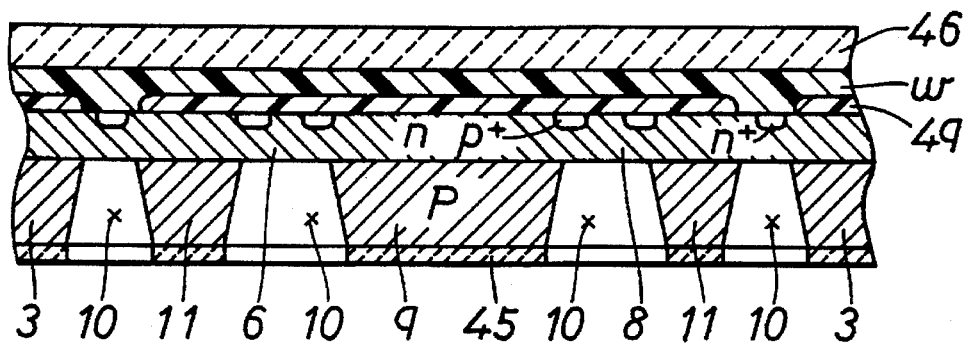

Next, as shown in FIG. 6, electrochemical etching of the wafer 40 is performed to form the lower separation grooves 10.

Figure 10:
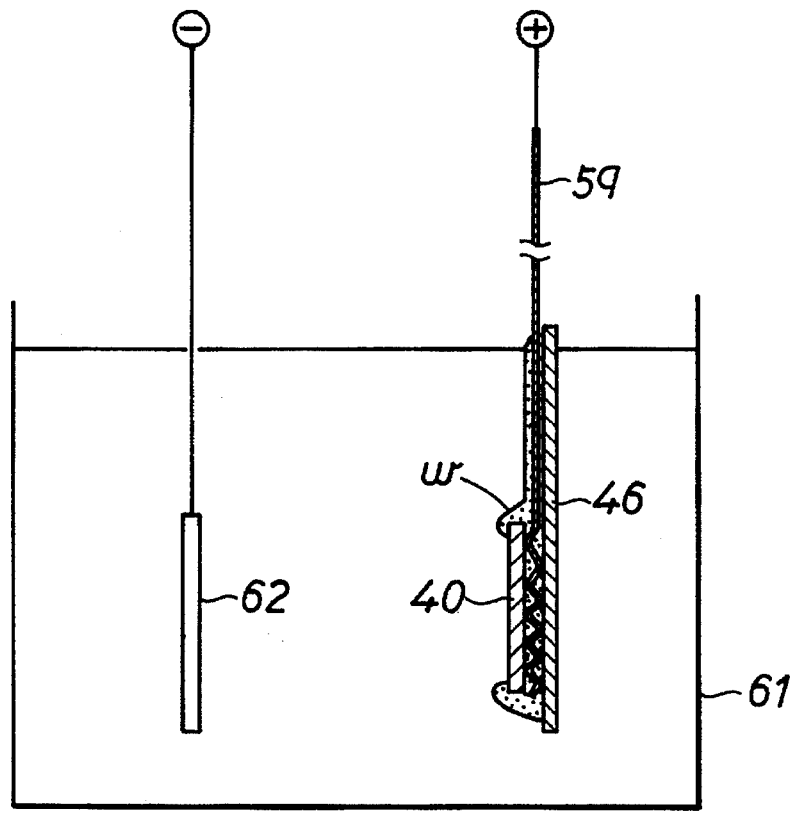
Figure 11:
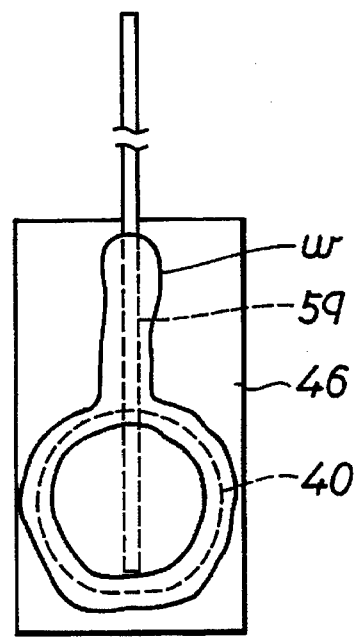

This electrochemical etching will be explained herein in detail using FIG. 10 and FIG. 11.

At first, a hot plate (200° C., not shown) is joined to the back face of a support substrate 46, a resin wax W is placed on the support substrate 46 to soften it, the front main face of the wafer 40 is placed and adhered thereon with interposing a platinum ribbon 59, and thereafter the support substrate 46 and the wafer 40 are detached from the hot plate so as to cure the resin wax W. The forward end portion of the platinum ribbon 59 is formed to have a wave shape, the forward end portion of the platinum ribbon 59 is pressurized to the above-mentioned aluminum contact portion by its own elasticity in the cured state of the above-mentioned resin wax W, and good electric contact is provided with respect to the above-mentioned aluminum contact portion. Incidentally, the resin wax W coats the side face of the wafer 40.

In this state, the wafer 40 and the support substrate 46 are perpendicularly hung in an etching tank 61, which are immersed in an etching solution (for example, 33 wt % KOH solution, 82° C. A platinum electrode plate 62 is perpendicularly hung as opposing the back main face of the wafer 40, a predetermined voltage (at least 0.6 V, but 2 V in this case) is applied between the platinum ribbon 59 and the platinum electrode plate 62 in which the wafer 40 side is positive, and the electrochemical etching is performed. By doing so, an electric field is formed from the platinum ribbon 50 through the aluminum contact portion, the n$^+$ diffusion layer 44 and the epitaxial layer 42 to the P-type substrate 41 to make reverse bias of the junction between the both, the electrochemical etching (anisotropic etching) of the substrate 41 is performed, and the lower separation grooves 10 are formed in the substrate 41. When the etching arrives at the vicinity of the junction portion between the substrate 41 and the epitaxial layer 42, an anodic oxidation film (not shown) is formed, and the etching speed is markedly reduced, so that the etching stops at the vicinity of the junction portion.

Figure 7:
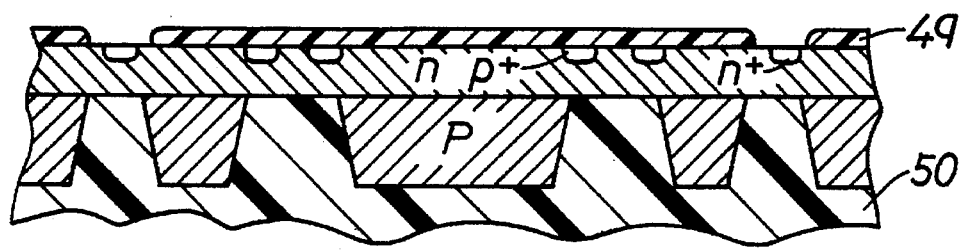

Next, as shown in FIG. 7, after the nitride film 45 is removed with hydrofluoric acid, the support substrate 46 is placed on the hot plate to soften the resin wax W, the wafer 40 is separated from the support substrate 46, the separated wafer 40 is immersed in an organic solvent (for example, trichloroethane), the resin wax W is dissolved and washed to take out the wafer 40, and thereafter a resist 50 is applied onto the back main face of the wafer 40 for the entire surface.

Incidentally, since this resist 50 is not for photo-patterning, it is sufficient to only allow a resist solution to flow, and it is unnecessary to perform vacuum chuck of the wafer 40 on a spinning table of a spinning apparatus as in the case of resist application for photo-patterning (for example, the resist film 49).

Figure 8:
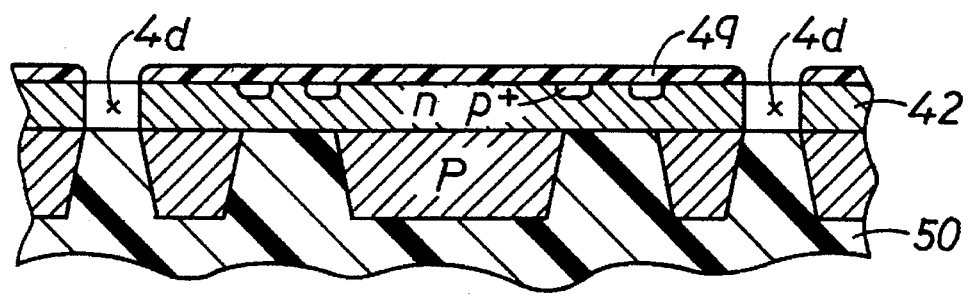

Next, as shown in FIG. 8, dry etching of the epitaxial layer 42 is performed from the opening of the resist film 49 to form the upper separation grooves 4a, 4b, 4c, 4d.

Figure 9:
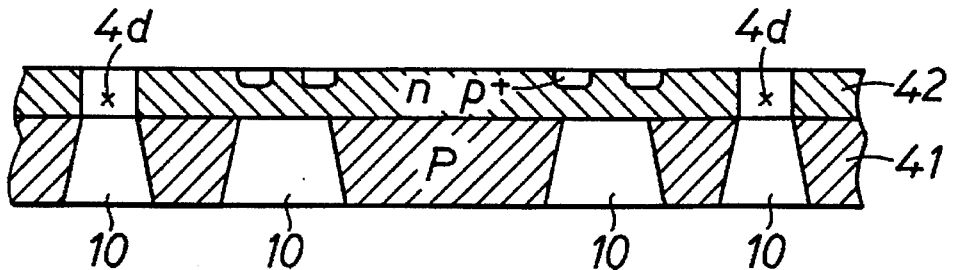

Next, as shown in FIG. 9, the resist film 49 is removed by oxygen ashing, the resist 50 is removed to complete the upper separation grooves 4a, 4b, 4c, 4d, and the upper separation grooves 4a, 4b, 4c, 4d are communicated with the lower separation grooves 10 to form the penetrating groove. Subsequently the wafer 40 is joined onto the pedestal 1, and finally dicing is perform to make a chip, thereby the sensor chip shown in FIG. 1 to FIG. 3 is produced.

Figure 12:
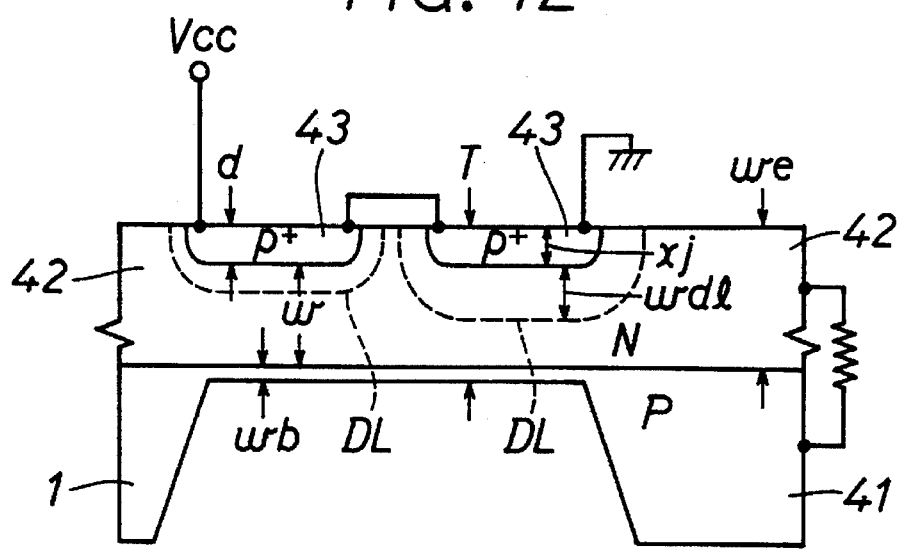
FIG. 12 is an illustrative cross-sectional view of the sensor element.

The design of the high sensitivity sensor capable of reducing the leak current including the setting method for the thickness of the thin thickness distortion-causing portions 5–8 as an important part of the present example will be explained hereinafter in turn with reference to FIG. 12.

(Determination of the thickness of the thin thickness distortion-causing portions 5–8)

Figure 13:
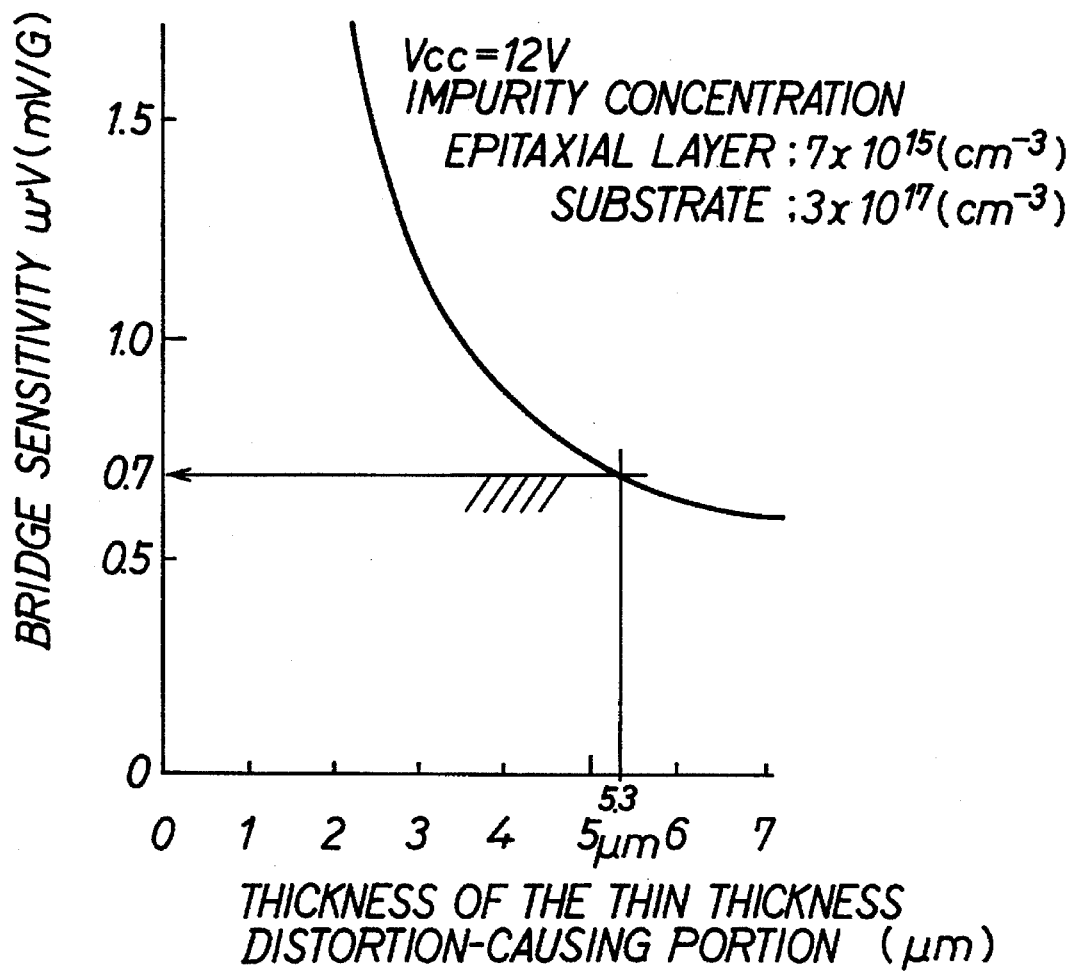
FIG. 13 is a figure of characteristics showing a relation between the bridge sensitivity of the sensor shown in FIG. 1 and the thickness of the thin thickness distortion-causing portion (beam)

In the present example, the bridge sensitivity of the sensor is 0.7 mV/G. According to this target bridge sensitivity, on the basis of a relation between the bridge sensitivity and the thickness of the thin thickness distortion-causing portions 5–8 shown in FIG. 13, the thickness T of the thin thickness distortion-causing portions 5–8 is determined. It is understood that T may be 5.3 μm in this case.

(Determination of the bridge input voltage)

In this example, the bride input voltage Vcc, which is applied between the high level input terminal and the low level input terminal of the bridge constituted by connecting the piezoresistance regions 13a, 13b, 14a, 14b, 15a, 15b, 16a, 16b as shown in FIG. 4, is 12 V, and the low level input terminal of the bridge is grounded.

This is due to the fact that the signal processing circuit unit and the power source voltage in the latter stage are made common, in order to realize simplification of the power source unit, simplification of wiring arrangement, and compatibility.

In this state, the thin thickness distortion-causing portions 5–8 constitute junction diodes with the piezoresistance region, that is the $P^+$ region 43, so that the electric potential of the thin thickness distortion-causing portions 5–8 becomes a value (about 0.7 V) which is higher by a barrier electric potential between the both, however, in this specification, the electric potential of the thin thickness distortion-causing portions 5–8 is approximately regarded to be equal to the highest electric potential of the $P^+$ region 43.

Incidentally, the substrate 41 and the thin thickness distortion-causing portions 5–8 are in the resistance connection state at the chip end face, and the substrate 41 can be regarded to have an electric potential equal to that of the epitaxial layer 42 (thin thickness distortion-causing portions 5–8).

Alternatively, it is also available that the $n^+$ region for fixing the electric potential is formed as described above on the surface of the epitaxial layer 42, and this $n^+$ region is connected to the aluminum wiring arrangements 19, 23 (Vcc line). This $n^+$ region can be formed by the same process as that for the $n^+$ region 44. By doing so, the electric potential change in the epitaxial layer 42 is suppressed, and the change in the output signal voltage due to this electric potential change can be suppressed. It is of course possible to give a direct current electric potential which is different from the power source voltage that is the aluminum wiring arrangements 19, 23 to the above-mentioned $n^+$ region, however, in this case, an input terminal for fixing the electric potential of the epitaxial layer 42 and a power source are newly required, which only results in complex device constitution, and is not a wise policy. Namely, it is simplest that the high level input terminal 32 of the bridge and the epitaxial layer 42 are fixed to be the same electric potential (or including the above-mentioned approximately the same electric potential).

(Determination of the impurity concentration in the substrate 41)

According to the above-mentioned electrochemical etching, as clarified for the first time in this case from experimental characteristic figures of FIG. 14 and FIG. 15 as described hereinafter, it is considered that the etching stops at the forward end at the side of the substrate 41 of the junction depletion layer of the epitaxial layer 42 and the substrate 41. Therefore, in this example, the impurity concentration in the substrate 41 is set to be $3\times10^{17}$ atoms/cm$^3$. Next, the reason thereof will be explained.

Namely, at the back face of the distortion-causing portion of the sensor, the plane-shaped depletion layer or the second conductive type channel (hereinafter referred to as the back face channel) is formed, and due to contamination, large amounts of recombination centers, levels, traps and the like are formed. Further, on account of the electrochemical etching, the end portion of the semiconductor substrate of the same conductive type as the piezoresistance region is located on the same straight line as the back face of the distortion-causing portion. Therefore, in the case of the use as a sensor, when the junction depletion layer between the $P^+$ region 43 and the epitaxial layer 42 (thin thickness distortion-causing portions 5–8) arrives at the back face of the distortion-causing portion, the reverse bias current (hereinafter referred to as the leak current) between the piezoresistance region and the distortion-causing portion increases, the leak current flows between the piezoresistance region and the substrate through the back face channel and the above-mentioned junction depletion layer, and the leak current due to direct punch-through flows between the substrate and the piezoresistance region without passing through the above-mentioned back face channel. As described above, it is considered that the PN junction between the substrate 41 and the epitaxial layer 42 makes a short circuit due to parasitic resistance at the end face portion and the like, so that the above-mentioned leak current flows from the piezoresistance region through the substrate to the distortion-causing portion. Incidentally, as described above, the distortion-causing portion is usually connected to one end of the piezoresistance region, and the 0 bias barrier electric potential is given with respect to one end of the piezoresistance region even when there is no connection, so that consequently the above-mentioned leak current flown into the distortion-causing portion is added to the signal current flowing in the piezoresistance region and outputted. In addition, this leak current contains large amounts of heat noise (which is proportional to a square root of R), fluctuation noise, 1/f noise and popcorn noise, and its current passage is unstable, so that the change is large, the change ratio due to temperature change is also large, resulting in the level change in the sensor output voltage and the decrease in the S/N ratio. Therefore, in order to suppress the influence by the leak current, on condition that a certain degree of the thickness of the epitaxial layer 42 is ensured, it is necessary to make the thickness of the thin thickness distortion-causing portions 5–8 to be markedly thinner than those in the prior art.

In this case, according to experiments by the present inventors, it has been clarified that the etching stop position during the electrochemical etching stops at the forward end extending to the side of the substrate 41 of the junction depletion layer between the epitaxial layer 42 and the substrate 41 depending on the voltage applied during the etching.

Figure 14:
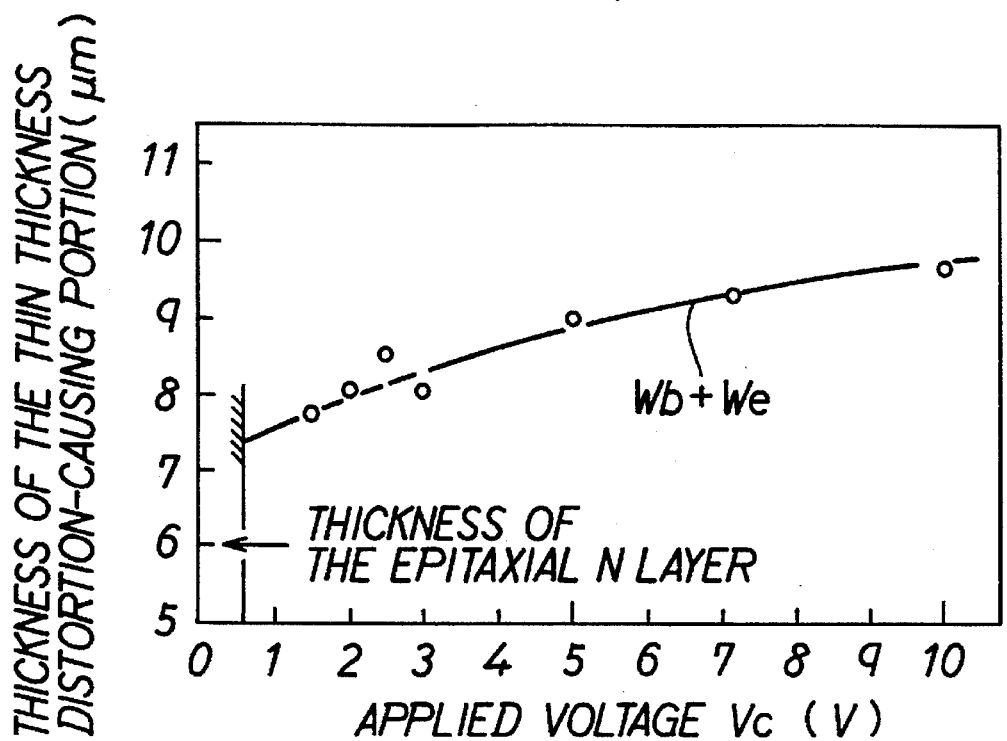
FIG. 14 is a figure of characteristics showing a relation between the application voltage in the electrochemical etching and the thickness of the thin thickness distortion-causing portion.

In FIG. 14, illustration is made using a plot for the change in the thickness of the thin thickness distortion-causing portions 5–8 when the thickness of the epitaxial layer 42 We is 6 μm, and the application voltage Vc is changed in the electrochemical etching in FIG. 6. In addition, the sum (calculated value) of the depletion layer width Wb at the side of the substrate 41 and the thickness we of the epitaxial layer 42 is illustrated as a characteristic line.

According to FIG. 14, it is understood that the thickness of the thin thickness distortion-causing portions 5–8 coincides with Wb+We.

Figure 15:
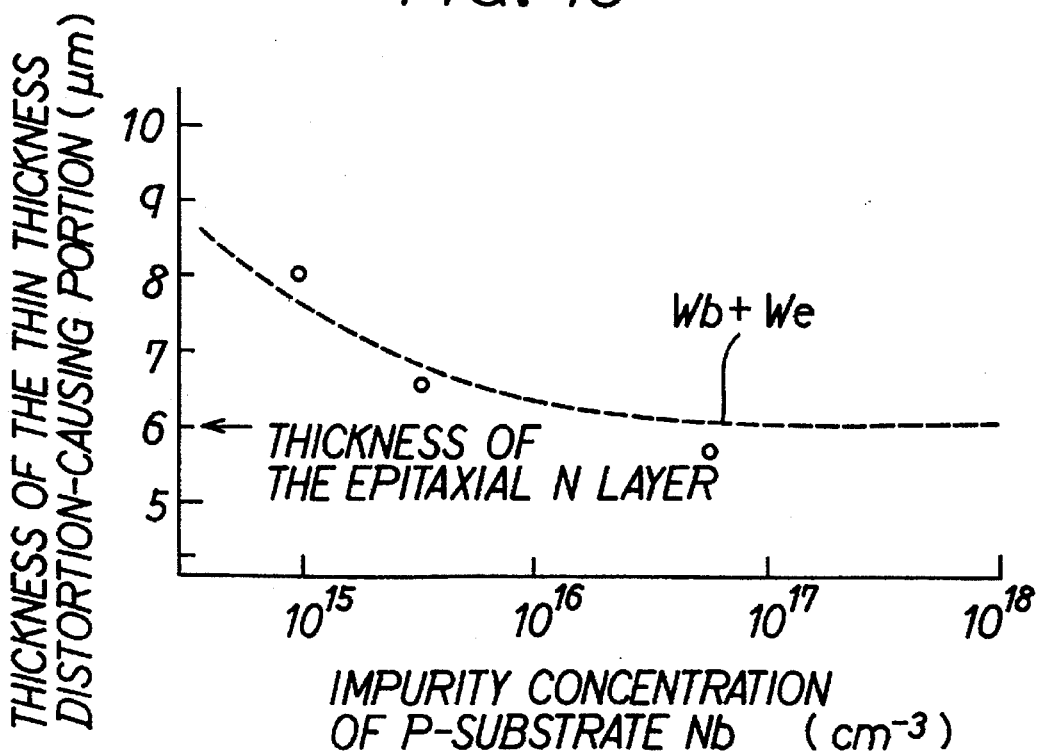
FIG. 15 is a figure of characteristics showing a relation between the impurity concentration in the substrate in the electrochemical etching and the thickness of the thin thickness distortion-causing portion.

In addition, in the electrochemical etching in FIG. 6, the change in the thickness of the thin thickness distortion-causing portions 5–8 is shown as a plot in FIG. 15 when the thickness We of the epitaxial layer 42 is 6 μm, the application voltage Vc is 2 V, the impurity concentration in the epitaxial layer 42 is $7 \times 10^{15}$ atoms/cm$^3$, and the impurity concentration Nb in the substrate 41 is changed. In addition, the sum (calculated value) of the depletion layer width Wb at the side of the substrate 41 and the thickness We of the epitaxial layer 42 is illustrated as a characteristic line.

Also from FIG. 15, it is understood that the thickness of the thin thickness distortion-causing portions 5–8 coincides with Wb+We.

According to the above-mentioned experiment results, it is understood that in order to make the thickness T of the thin thickness distortion-causing portions 5–8 to be the designed thickness, it is preferable to use T=We+Wb.

Therefore, in order to allow the stop position of the electrochemical etching to approach the junction between the epitaxial layer 42 and the substrate 41 as close as possible, the portion extending to the side of the substrate 41 of the junction depletion layer may be narrowed. For this purpose, it is necessary that the impurity concentration in the substrate 41 is made to be a high concentration as far as possible. On the other hand, according to experiments, it has been clarified that when the impurity concentration in the substrate 41 is not less than $2 \times 10^{18}$ atoms/cm$^3$, the etching speed lowers, and the etching of the substrate 41 becomes difficult. In addition, when the application voltage is not more than 0.6 V, the anodic oxidation film is not formed on the etching surface well, so that the etching speed rises, and the etching stop becomes difficult.

Therefore, when the impurity concentration in the substrate 41 is not less than $1 \times 10^{16}$ atoms/cm$^3$ but not more than $2 \times 10^{18}$ atoms/cm$^3$, more preferably $1–8 \times 10^{17}$ atoms/cm$^3$, then it becomes possible to provide a synergistic effect of the high sensitivity realization and the leak current suppression.

(Determination of the thickness of the epitaxial layer 42)

The thickness we (W in the present application) of the epitaxial layer 42 is designed as T-wb provided that the thickness of the thin thickness distortion-causing portions 5–8 is T=5.3 μm, and the thickness of the etching remaining portion (remaining P-type region) of the substrate 41, that is the depletion layer width at the side of the substrate 41 is wb.

$$we = T - wb \quad (1)$$

wb is determined as follows.

From the impurity concentration Nb ($3 \times 10^{17}$ atoms/cm$^3$) in the substrate 41, and the impurity concentration Ne in the epitaxial layer 42, the width wb extending to the side of the substrate 41 of the junction depletion layer between the substrate 41 and the epitaxial layer 42 is determined by:

$$wb^2 = 2K\xi(Vc+V_0)/(qNb(1+Nb/Ne)) \quad (2)$$

Incidentally, K is the dielectric constant of the silicon, ξ is the vacuum dielectric constant, Vc is the application voltage in the electrochemical etching, $V_0$ is the barrier voltage at 0 bias between the epitaxial layer 42 and the substrate 41, q is the electric charge amount of electron, and an assumed value is used for Ne.

(Determination of the impurity concentration and the depth of the P$^+$ region 43)

The depth d of the P$^+$ region 43 for constituting the piezoresistance regions 13a, 13b, 14a, 14b, 15a, 15b, 16a, 16b can be determined beforehand, which is 1.0 μm in this case. The impurity concentration in the P$^+$ region is formed to be a concentration which is higher than that in the n-type epitaxial layer 42 by not less than one digit. The reason thereof is that the junction depletion layer between the P$^+$ region 43 and the n-type epitaxial layer 42 is suppressed to extend to the side of the P$^+$ region 43, so as to reduce the change in the resistance value of the P$^+$ region 43 due to the electric potential change in the epitaxial layer 42 and the like. Incidentally, if the impurity concentration in the P$^+$ region 43 is too high, there are such harmful influences that its resistance value becomes small, the electric resistance of the aluminum wiring arrangement and the like cannot be neglected, and the temperature rising due to the increase in current also becomes impossible to neglect, while if the impurity concentration in the P$^+$ region 43 is too low, there are generated such harmful influences that the resistance noise of each piezoresistance increases, the ratio of the signal current to the leak current increases, and the S/N ratio increases. Because of these facts, in this case, the impurity concentration in the P$^+$ region 43 is $1 \times 10^{20}$ atoms/cm$^3$.

Therefore, in this case, it is assumed that all of the junction depletion layer between the P$^+$ region 43 and the epitaxial layer 42 extends to the side of the epitaxial layer 42.

(Determination of the impurity concentration in the epitaxial layer 42)

The effective thickness w of the epitaxial layer 42 just under the P$^+$ region 43 is one obtained by subtracting the depth d of the P$^+$ region 43 from the thickness we of the epitaxial layer 42.

When the junction depletion layer DL between the P$^+$ region 43 and the epitaxial layer 42 arrives at the back face of the thin thickness distortion-causing portions 5–8, the large increase in the leak current and the noise voltage is generated as described above, so that in order to prevent it, it is necessary that the width wdl of the junction depletion layer DL is smaller than w=we−d=T−wb−d.

The width wdl of the junction depletion layer DL can be calculated by the following equation:

$$wdl^2 = 2K\epsilon(Vcc+V_0)/(qNe(1+Ne/Np)) \quad (3)$$
$$= 2K\epsilon(Vcc+V_0)/(qNe) < (we-d)^2$$

therefore $$Ne = 2K\xi(Vcc+V_0)/(q \times wdl^2) > 2K\xi(Vcc+V_0)/(q(we-d)^2) \quad (4)$$

Incidentally, Np is the impurity concentration in the P$^+$ region 43, and Ne is the impurity concentration in the N-type epitaxial layer 42. It is preferable that wdl has a value which is smaller than the effective thickness w of the beam thickness by 1 μm taking safety into consideration.

Incidentally, in the above-mentioned calculation, if Ne assumed in the stage of (Determination of the thickness of the epitaxial layer 42) is greatly different from Ne determined herein, it is sufficient to correct the assumed value of Ne again to try the calculation again.

One example of a set of dimensions calculated in such a manner is described hereinafter.

The application voltage Vcc is 12 V, the impurity concentration in the substrate 41 is about $3 \times 10^{17}$ atoms/cm$^3$, the impurity concentration in the epitaxial layer 42 is about $7 \times 10^{15}$ atoms/cm$^3$, the impurity concentration in the P$^+$ region 43 is about $1 \times 10^{20}$ atoms/cm$^3$, the thickness T of the thin thickness distortion-causing portions 5–8 is about 5.3 μm, the depth of the P$^+$ region 43 is about 1.0 μm, and the junction depletion layer Wdl is about 1.5 μm.

Figure 16:
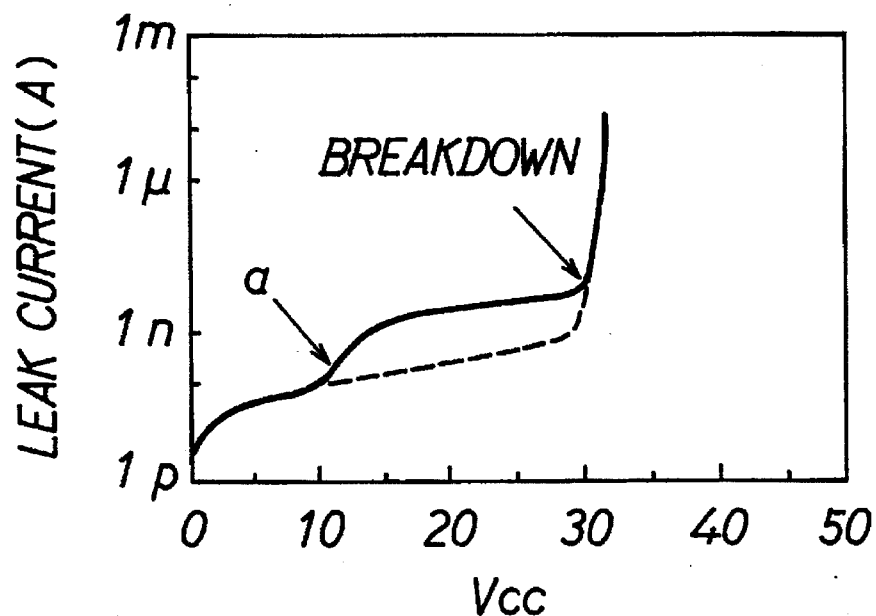
FIG. 16 is a figure of characteristics showing a relation between the application voltage and the leak current.
Figure 17:
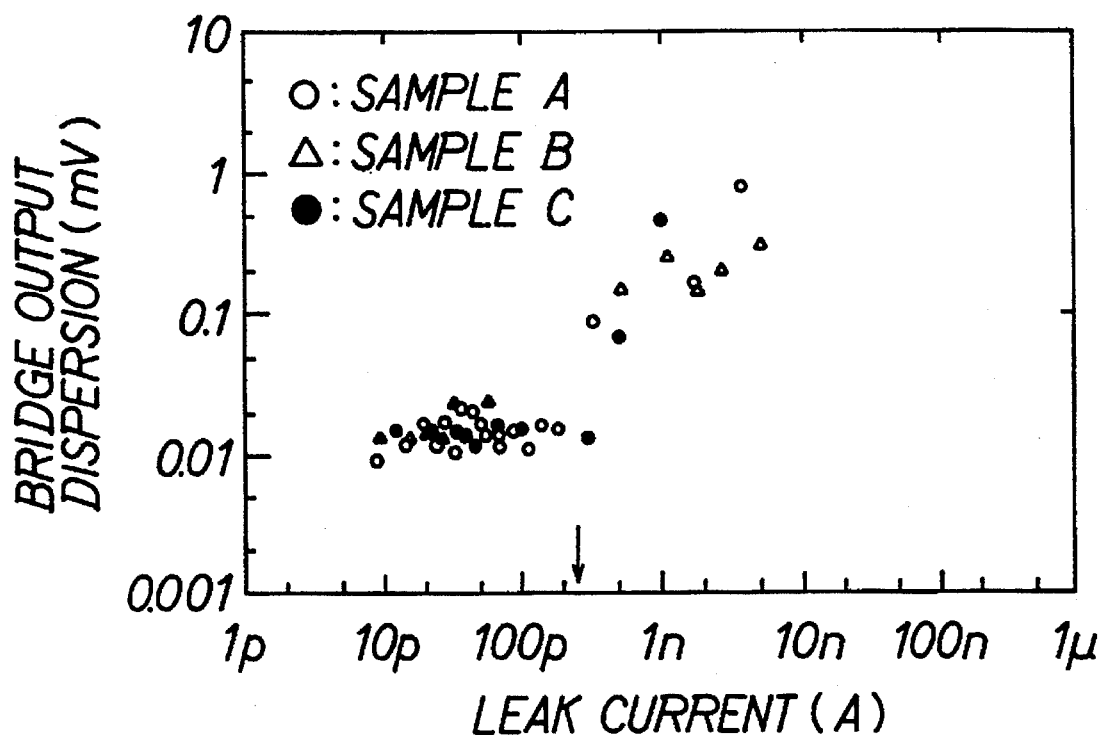
FIG. 17 is a figure of characteristics showing a relation between the leak current and the bridge output voltage.
Figure 18:
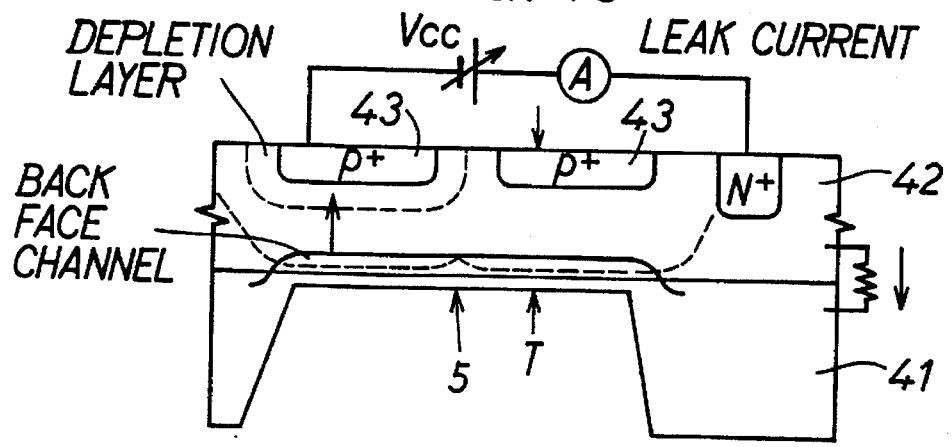
FIG. 18 is an illustrative cross-sectional view showing the passage for the leak current.

Next, experiment results for confirming the above-mentioned increase in the leak current are shown in FIG. 16 and FIG. 17, and the reason thereof will be explained on the basis of an illustrative cross-sectional view of FIG. 18 and a figure of a simplified equivalent circuit shown in the same figure together. However, measurement was done using a sample of FIG. 18. In this device, the impurity concentration in the substrate 41 was about $3 \times 10^{17}$ atoms/cm$^3$, the impurity concentration in the epitaxial layer 42 was about $7 \times 10^{15}$ atoms/cm$^3$, and the impurity concentration in the P$^+$ region 43 was about $1 \times 10^{20}$ atoms/cm$^3$, wherein the thickness T of the thin thickness distortion-causing portion 5 was about 2.5 μm which was approximately the same as the thickness of the epitaxial layer 42, and the depth of the P$^+$ region 43 was about 1.0 μm. In addition, the n$^+$ region for fixing the electric potential was provided on the surface of the epitaxial layer 42.

A variable Vcc was applied between it and the P$^+$ region 43, and the leak current was investigated. According to FIG. 16 showing the result thereof, when Vcc which allows the forward end of the junction depletion layer to approach the back face is applied, namely from the point a at which Vcc exceeds 11 V, the leak current begins to conspicuously increase, and breakdown of the PN junction takes place at 30 V. In the meantime, the width (calculated value) at the side of the epitaxial layer 42 of the junction depletion layer between the epitaxial layer 42 and the P$^+$ region 43 at Vcc=11 V in the case of above-mentioned dimensions is about 1.5 μm.

Next, using three samples A, B and C, the relation between the leak current and the dispersion in the bridge output voltage was investigated. The result thereof is shown in FIG. 17. However, details of the samples A, B and C are as follows. Dimensions are the same as those as described above. However, the thickness of the thin thickness distortion-causing portion was 3.5 μm for A, 3.0 μm for B, and 2.5 μm for C.

According to FIG. 17, it is understood that when the leak current begins to rapidly increase, the dispersion in the output voltage of the bridge rapidly increases.

As described above, it has been found that when the junction depletion layer arrives at the back face of the thin thickness distortion-causing portion 5, the current flows in the order of the N$^+$ region for fixing the electric potential, the epitaxial layer 42, the substrate 41, the back face channel, the junction depletion layer, the P$^+$ region 43 and the like, the leak current increases, and the bridge output voltage disperses. In addition, the noise voltage also of course increases.

Therefore, as in the present example, the impurity concentration Ne in the thin thickness distortion-causing portion (epitaxial layer 42) is made not less than $2K\xi(Vcc+V_o)/(q(we-d)^2)$, thereby at the rated voltage Vcc of the sensor, the junction depletion layer between the piezoresistance region and the thin thickness distortion-causing portion cannot arrive at the PN junction at the back face side of the thin thickness distortion-causing portion, and consequently the leak current as described above in detail becomes extremely small. Thus, the improvement in the sensor sensitivity by the thin thickness formation in the distortion-causing portion can be realized in a state in which the change in the output voltage depending on the magnitude of the leak current and the decrease in the S/N ratio are suppressed while well maintaining the conformity with peripheral circuits such as for example a power source unit and the like.

(Modified embodiment 1)

In the above-mentioned example, the impurity concentration in the P-type substrate 41 is made constant, and the thickness of the epitaxial layer 42 is set taking the depletion layer width wb into consideration, however, instead thereof, it is also preferable that a P$^+$ layer (for example, not less than $10^{18}$ atoms/cm$^3$) is provided on the surface of the P-type substrate 41.

By doing so, the extending amount of the junction depletion layer which extends from the junction plane between the epitaxial layer 42 and this P$^+$ layer toward the side of the P$^+$ layer becomes extremely small, and consequently the etching can be regarded to stop approximately at the above-mentioned junction plane, therefore the thickness of the substrate 41 can be regarded as a necessary depth for the etching, and the operation becomes easy. Further, it is possible to reduce the width of the junction depletion layer extending to the side of the substrate 41 either by making the application voltage small, or by making the impurity concentration in the P-type substrate 41 thick, and the same effect as the above can be provided.

(Modified embodiment 2)

Figure 19:
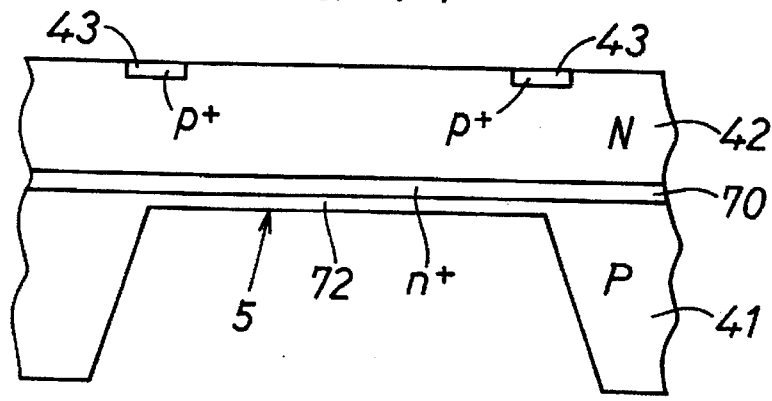
FIG. 19 is a cross-sectional view showing a modified embodiment of the first example.

Another modified embodiment will be explained on the basis of FIG. 19.

In this example, a thin n$^+$ epitaxial layer (depletion layer stopper region) 70 is formed between the n-type epitaxial layer 42 and the p-type substrate 41.

By doing so, the junction depletion layer between the P$^+$ region 43 and the epitaxial layer 42 is cut off by this n$^+$ epitaxial layer 70, which cannot arrive at the back face junction portion 72 of the thin thickness distortion-causing portion 5, and consequently it is possible to suppress the increase in the leak current and the increase in the noise voltage.

This n$^+$ epitaxial layer 70 can be formed when the impurity doping amount is increased at the initial stage of the epitaxial layer 42. In addition, it is also preferable that an n-type impurity having a diffusion speed faster than that of the impurity in the P$^+$ substrate 41 is doped beforehand on the surface of the P$^+$ substrate 41, so as to form by auto-doping in the epitaxial step for the epitaxial layer 42.

Incidentally, the impurity concentration in the n$^+$ epitaxial layer (depletion layer stopper region) 70 is not less than $5 \times 10^{16}$ atoms/cm$^3$, preferably $1 \times 10^{17}$ to $1 \times 10^{20}$ atoms/cm$^3$.

SECOND EXAMPLE

Next, an integrated semiconductor pressure sensor, in which the second example of the present invention is applied, will be explained in accordance with drawings.

Figure 20:
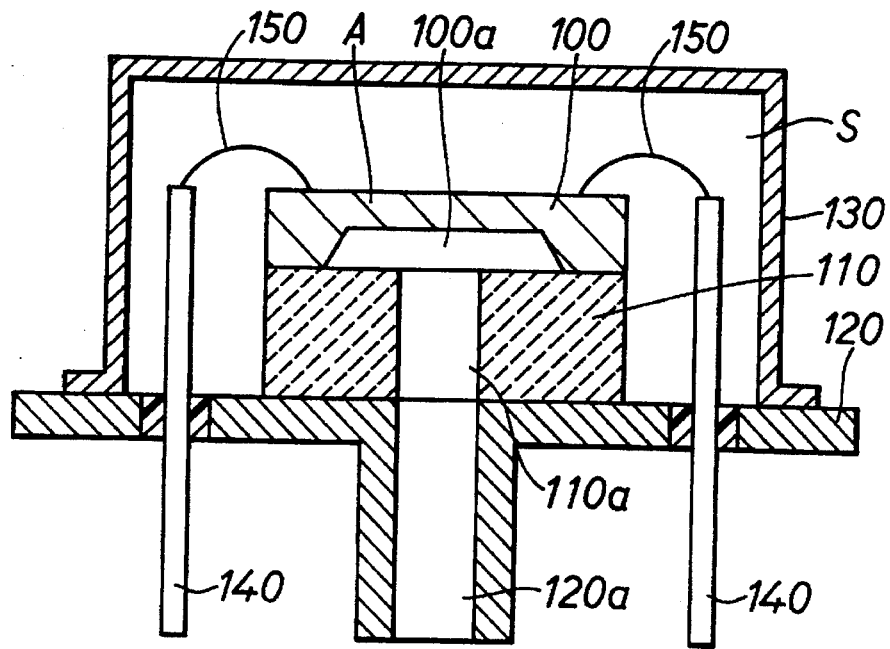
FIG. 20 is a cross-sectional view of an integrated semiconductor pressure sensor in which the second example is applied.

In FIG. 20, a silicon chip 100 is joined onto a pedestal 110 having a hole opened composed of Pyrex glass, and the pedestal 110 is joined onto a stem 120. 130 is a metallic can which is welded to the peripheral portion of the stem 120 so as to make the interior to be an air-tight standard pressure chamber S.

Inner ends of terminal pins 140 fixed to hole portions of the stem 120 by seal glass are individually connected to each of bonding pads (not shown) on the silicon chip 100 by means of wires 150. A concave groove 100a is dug and provided at the back face of the silicon chip 100, and a pressure subjected to measurement is introduced into the concave groove 100a through holes 110a, 120a for introducing the pressure subjected to measurement which are provided by penetrating through the pedestal 110 and the stem 120, respectively.

The above-mentioned concave groove 100a is formed by anisotropic etching as described hereinafter, and a thin thickness portion of the silicon chip 100 adjoining the concave groove 100a is referred to as the thin thickness distortion-causing portion A hereinafter.

Figure 21:
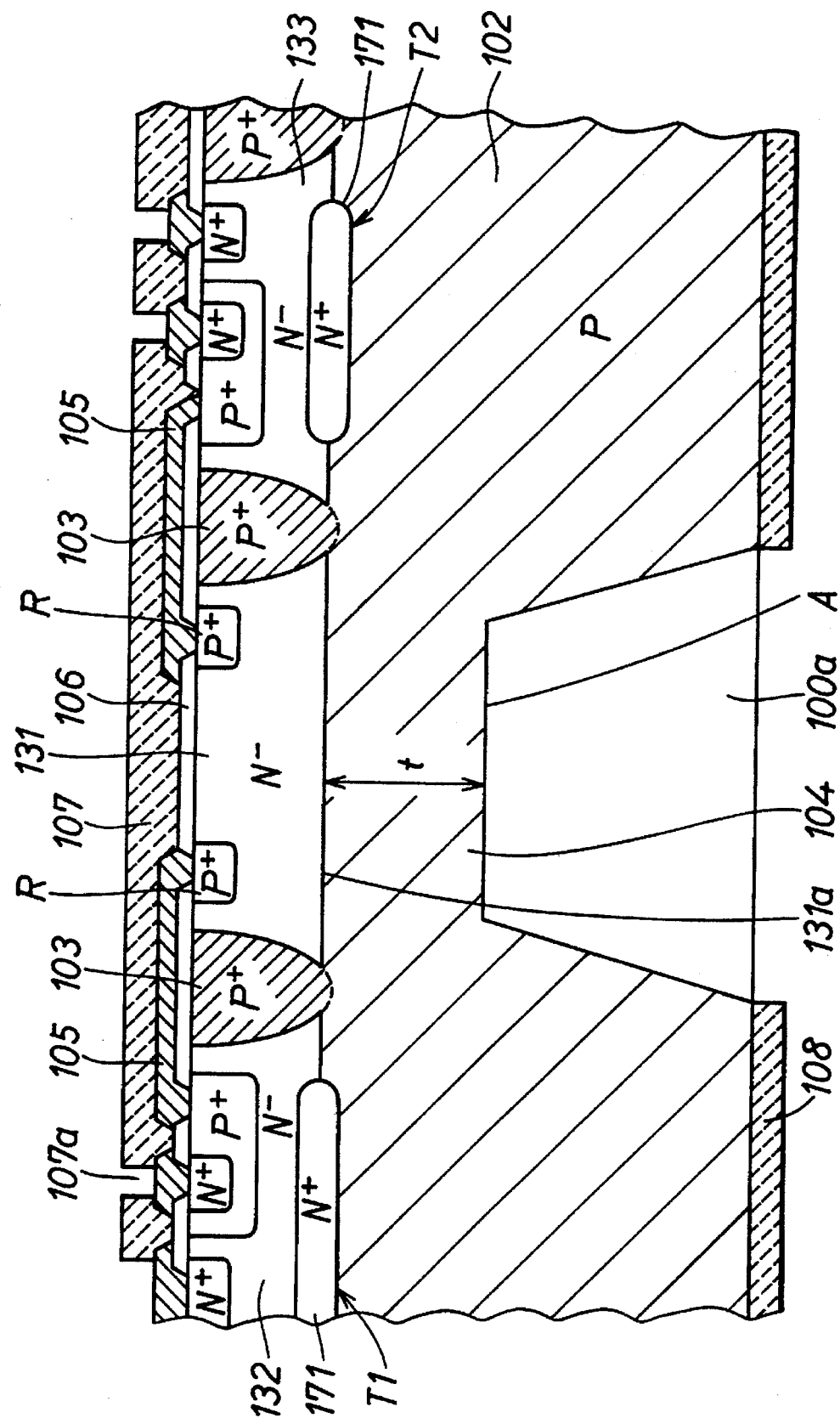
FIG. 21 is a cross-sectional view of the sensor chip in FIG. 20.

On this silicon chip 100 are formed a Wheatstone bridge circuit comprising two pairs of piezoresistance regions (two individuals are shown in FIG. 21) R, and a bipolar integrated circuit for constituting an amplification circuit for amplifying its output signal and a temperature compensation circuit.

Figure 22:
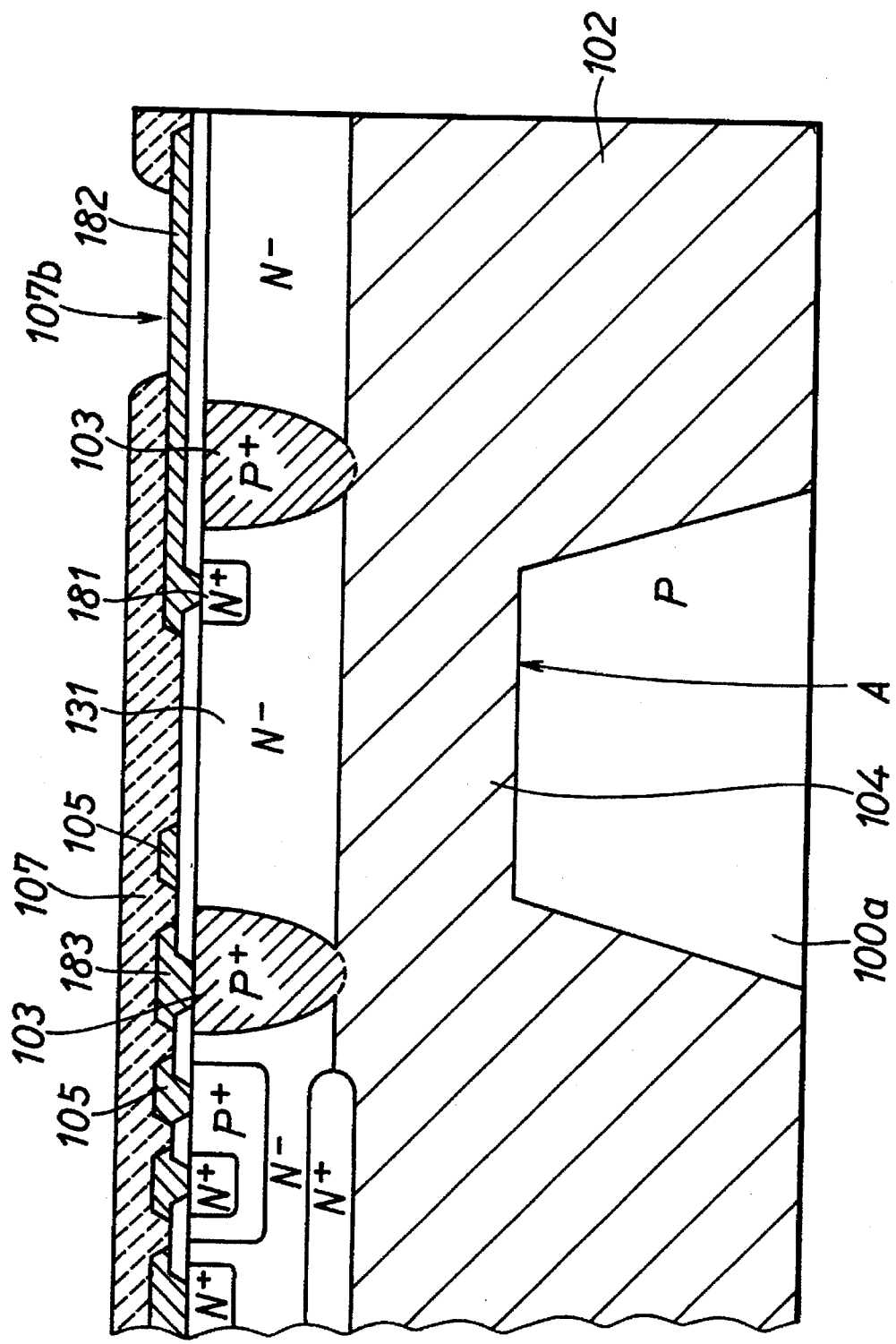
FIG. 22 is a cross-sectional view of the sensor chip in FIG. 20.

The structure of the semiconductor pressure sensor of the present example will be explained hereinafter with reference to FIG. 21 and FIG. 22 showing cross-sections of the silicon chip 100. However, FIG. 21 is a cross-sectional view at a portion of the piezoresistance regions R, and FIG. 22 is one at a portion in which there is no piezoresistance region R. Incidentally, in FIG. 21, at the surface portion of the thin thickness distortion-causing portion A, actually a pair of the piezoresistance regions R are formed at the peripheral portion of the thin thickness distortion-causing portion A, and a pair of the piezoresistance regions R are formed being located at the central portion, however, in FIG. 21, only the piezoresistance regions R, R at the peripheral portion of the thin thickness distortion-causing portion A are illustrated.

The silicon chip 100 has a P-type semiconductor substrate 102 in which the crystal axis is inclined by several degrees with respect to the (110) plane or the (100) plane, and at the surface portion of the semiconductor substrate 102 are formed a plurality of $N^-$ epitaxial layer regions 131, 132, 133 separated with each other by $P^+$ separation regions 103. The epitaxial layer region 131 constitutes the surface layer region as referred to in the present invention, and the epitaxial layer regions 132, 133 constitute the active regions as referred to in the present invention.

The above-mentioned two pairs of piezoresistance regions R are formed at the surface portion of the epitaxial layer region 131, and bipolar transistors T1, T2 are individually formed at the epitaxial layer regions 132, 133. Each of these bipolar transistors constitutes a first stage transistor of a differential amplifier. Of course, on the surface of the silicon chip 100 are formed other epitaxial layer regions (not shown) isolated and separated with each other by the $P^+$ separation regions 103, and resistors and other transistors are formed in these epitaxial layer regions. And the $P^+$ separation regions 103 are connected to the P-type semiconductor substrate 102, to provide PN junction separation of each of the epitaxial layer regions 131, 132, 133 . . . with each other.

Between the bottom face 131a of the epitaxial layer region 131 and the bottom face of the concave groove 100a is formed a coating region 104 having a predetermined thickness composed of the semiconductor substrate 102, and this coating region 104 and the epitaxial layer region 131 coated by this coating region 104 constitute the thin thickness distortion-causing portion A as referred to in the present invention.

Additionally, 105 is aluminum wires for connecting each one end of the piezoresistance regions R to each one end of the bipolar transistors T1, T2, being formed on a silicon oxide film 106. The aluminum wire 105 is contacted with the piezoresistance region R and each of other contact portions through openings of the silicon oxide film 106. 107 is a passivation film composed of a plasma nitride silicon film, and 107a is an opening for wire bonding.

As shown in FIG. 22, an $N^+$ contact region 181 is formed on the surface of the $N^-$ epitaxial layer region 131, and an aluminum wire 182 having one end connected to the $N^+$ contact region 181 is provided and extended on the chip peripheral region. In addition, an opening 107b is provided in the passivation film 107 on the chip peripheral region, and the aluminum wire 182 exposed from this opening 107 is used as an electrode during the electrochemical etching. Incidentally, it is preferable that this opening 107b is coated and protected with an insulation film such as polyimide or the like after the electrochemical etching and before the wafer scribing, or it is also preferable that the region is exactly used for an electrode pad for fixing the electric potential which fixes the island electric potential of the epitaxial layer region 131 at the highest electric potential (Vcc) of the circuit.

In addition, the $P^+$ separation region 103 is contacted by an aluminum wire 183, thereby the $P^+$ separation region and the P-type semiconductor substrate 102 are fixed at the lowest electric potential (grounding) of the circuit.

The thin thickness distortion-causing portion A is distorted due to a differential pressure applied to the thin thickness distortion-causing portion A, and the piezoresistance region R makes displacement which is detected by the bridge circuit, which is the same as in the prior art.

Production steps for this sensor will be explained hereinafter with reference to FIG. 21.

At first, the P substrate 102 is prepared, an $N^+$ embedding region 171 is diffused, the N-type epitaxial layer is subjected to epitaxial growth, and each of the piezoresistance regions R, the transistors T1, T2, resistors and the like are formed. Namely, using an ordinary production process for bipolar integrated circuits, the piezoresistance regions R, the $P^+$ separation regions 103, the NPN transistors T1, T2, and each of the resistors are formed, and then formation of the silicon oxide film 106, formation of its contact opening, formation of the aluminum wire 105, formation of the P-SiN passivation films 107, 108, and formation of the opening 107a for wire bonding of the sensor chip and the opening 107b for the electrochemical etching are successively performed.

Next, the plasma nitride film (P-SiN) 108 on the surface of the planned region for the formation of the concave groove 100a is selectively opened.

And this wafer 40 is electrochemically etched, and the formation of the concave groove 100a is performed. Incidentally, this electrochemical etching is carried out in the same manner as the steps shown in FIG. 10 and FIG. 11 as described above, which is performed, for example, by applying a predetermined voltage Vc (10 V in this case) between a feeder electrode (the above-mentioned aluminum wire 182) which is necessary during the electrochemical etching and a counter platinum electrode in an etching tank. At the final period in the electrochemical etching, when the etching arrives at the vicinity of the junction portion between the substrate 102 and the epitaxial layer region 131, an anodic oxidation film (not shown) is formed, and the etching speed is markedly reduced, so that the etching stops at the vicinity of the junction portion.

And the plasma nitride film (P-SiN) 108 is removed by etching, subsequently the wafer 40 is subjected to dicing to make a chip. As shown in FIG. 20, this chip is joined onto the pedestal 110 by means of the electrostatic joining method, and wire bonding 150 is performed.

As described in detail in the above-mentioned first example, the thickness of the thin thickness distortion-causing portion A after the etching is equal to the sum of the thickness of the epitaxial layer region 131 and the depletion layer width wb extended to the side of the P substrate 102 depending on the voltage Vc applied during the etching. Therefore, without changing the semiconductor production process, namely without changing the thickness of the epitaxial layer which constitutes each semiconductor device, it is possible to obtain the thin thickness distortion-causing portion A having a precisely desired thickens simply by controlling the application voltage Vc during the electrochemical etching.

Moreover, it is easy to obtain the coating region 104 having the thickness sufficient to protect the back face 131a of the epitaxial layer region 131 from contamination and minute wounds which may be a factor to decrease the sensor S/N ratio during the use of the sensor.

Further, in the present example, the impurity concentration in the substrate 102 is $1\times10^{15}$ atoms/cm$^3$, the impurity concentration in the epitaxial layer region 131 is $2\times10^{15}$ atoms/cm$^3$, and the maximum rated voltage (maximum value of the voltage permitted to use) Vcc applied between the epitaxial layer region 131 and the substrate 102 is set to be smaller than the etching voltage Vc. Therefore, the PN junction depletion layer width extending to the side of the semiconductor substrate 102 is made by the etching voltage Vc larger than the PN junction depletion layer width extending to the side of the above-mentioned semiconductor substrate 102 during the application of the maximum rated voltage Vcc of the semiconductor sensor. By doing so, even in the case of application of the maximum rated voltage Vcc of the semiconductor sensor, the forward end of the above-mentioned depletion layer does not arrive at the surface of the contaminated coating region 104. Therefore, there is no case in which the dark current (leak current) of the depletion layer flows into the epitaxial layer region 131 to become the noise current, and it is possible to achieve a high S/N ratio as a sensor.

(Modified embodiment)

In the case of the sensor of the present second example as explained above, the N$^+$ contact region 181 is formed on the surface of the epitaxial layer region 131, and this N$^+$ contact region 181 is communicated with the aluminum wire 182 to feed the electricity, however, it is also available that the electricity is fed to the epitaxial layer region 131 through an aluminum wire (or a polysilicon wire) connected to the piezoresistance region R. In addition, an N$^+$ embedding region may be formed at the bottom face 131a of the epitaxial layer region 131.

In addition, when plural types of semiconductor distortion sensors which are different in the thickness of the thin thickness distortion-causing portion A are produced by changing the etching voltage Vc with respect to each of wafers formed in the same semiconductor production steps, the plural types of sensors having different characteristics can be produced only by means of the voltage value control during the electrochemical etching without changing semiconductor production steps one by one, so that there is provided such an excellent effect that the plural types of sensors can be produced by means of simple production steps.

As described above, the explanation has been made for the monocrystal silicon substrate in the above-mentioned first and second examples, however, it is a matter of course that the application can be made to other semiconductor materials. In addition, it is a matter of course that the application can be made to capacity type acceleration sensors as the semiconductor distortion sensor.

Further, it is also possible to carry out such that each of the design concepts of the first example and the second example is combined.

What is claimed is:

1. A production method for a semiconductor dynamic sensor, comprising the steps of:

preparing a semiconductor member in which a first conductivity type semiconductor region and a second conductivity type semiconductor region form a PN junction; and immersing said semiconductor member in an etching solution while said PN junction is reverse biased, whereby a portion of said second conductivity type semiconductor region is electrochemically etched to form at said portion a thin thickness shaped distortion-causing portion, wherein said immersing step includes the steps of:

applying to said first conductivity type semiconductor region a voltage for reverse-biasing said PN junction; and adjusting a magnitude of said voltage during said electrochemical etching to form a depletion layer which extends from said PN junction into said second conductivity type semiconductor region by a thickness thicker than a thickness of a depletion layer extending from said PN junction to said second conductivity type semiconductor region at a time when said semiconductor dynamic sensor is actually used, wherein said adjusting step includes a step of adjusting said magnitude of said voltage to a certain value larger than a maximum rated voltage which is applied to said first conductivity type semiconductor region at a time when said semiconductor dynamic sensor is actually used.

2. A production method for a semiconductor dynamic sensor according to claim 1, wherein said preparing step includes a step of forming a second conductivity type piezoresistance region on said first conductivity type semiconductor region.

3. A production method for a semiconductor dynamic sensor according to claim 2, wherein said preparing step further includes a step of setting said first conductivity type semiconductor region to have a characteristic which prevents a depletion layer extending from a PN junction between said first conductivity type semiconductor region and said second conductivity type piezoresistance region to said first conductivity type semiconductor region from reaching said PN junction between said first conductivity type semiconductor region and said second conductivity type semiconductor region at a time when said semiconductor dynamic sensor is actually used.

4. A production method for a semiconductor dynamic sensor according to claim 3, wherein said setting step includes a step of determining an impurity concentration of said first conductivity type semiconductor region as said characteristic.

5. A production method for a semiconductor dynamic sensor according to claim 1, wherein said first conductivity type is an N-type and said second conductivity type is a P-type.

6. A production method for a semiconductor dynamic sensor, comprising the steps of:

preparing a semiconductor member in which a first conductivity type semiconductor region and a second conductivity type semiconductor region form a PN junction; and immersing said semiconductor member in an etching solution while said PN junction is reverse biased, whereby a portion of said second conductivity type semiconductor region is electrochemically etched to form at said portion a thin thickness shaped distortion-causing portion, wherein said immersing step includes a step of applying to said first conductivity type semiconductor region a voltage for reverse-biasing said PN junction while a magnitude of said voltage applied during said electrochemical etching is made larger than a maximum rated voltage applied to said first conductivity type semiconductor region during an actual use of said semiconductor dynamic sensor.

7. A production method for a semiconductor dynamic sensor according to claim 6, wherein said first conductivity type semiconductor region is of an N-type and said second conductivity type semiconductor region is of a P-type.

8. A production method for a semiconductor dynamic sensor, comprising the steps of:

preparing a wafer in which a monocrystal semiconductor layer of a first conductivity type having a thickness W is formed on a monocrystal semiconductor substrate of a second conductivity type;

forming a semiconductor distortion detecting means in said monocrystal semiconductor layer; and immersing said wafer in an etching solution so as to oppose said monocrystal semiconductor substrate of said second conductivity type to an electrode provided in said etching solution, and applying a voltage Vc between said monocrystal semiconductor layer of said first conductivity type and said electrode to perform an electrochemical etching of said monocrystal semiconductor substrate of said second conductivity type, whereby a thin thickness portion having a thickness T is formed, said thickness T and said thickness W satisfying the equation:

$$W=T-(2K\xi(Vc+Vo)/(qNb(1+Nb/Ne)))^{1/2}$$

wherein K is a dielectric constant of said monocrystal semiconductor, $\xi$ is the vacuum dielectric constant, Vo is a barrier voltage at 0 bias, q is the electric charge amount of electron, Nb is an impurity concentration of said monocrystal semiconductor substrate and Ne is an impurity concentration of said monocrystal semiconductor layer, said step of applying said voltage Vc including a step of adjusting said voltage Vc to a value larger than a maximum rated voltage Vcc applied to said monocrystal semiconductor layer during an actual use of said semiconductor dynamic sensor.

9. A production method for a semiconductor dynamic sensor according to claim 8, wherein said first conductivity type is an N-type and said second conductivity type is a P-type.

10. A production method for a semiconductor dynamic sensor according to claim 8, wherein said step of forming said semiconductor distortion detecting means includes a step of forming a second conductivity type diffusion layer in said monocrystal semiconductor layer.

11. A production method for a semiconductor dynamic sensor according to claim 10, wherein said step of preparing said wafer includes a step of setting said impurity concentration Ne of said monocrystal semiconductor layer in association with said thickness W to have a value which prevents a depletion layer extending from a PN junction between said diffusion layer and said monocrystal semiconductor layer to said monocrystal semiconductor layer from reaching said monocrystal semiconductor substrate at said actual use of said semiconductor dynamic sensor.

12. A production method for a semiconductor dynamic sensor according to claim 10, wherein said step of preparing said wafer includes a step of adjusting said impurity concentration Ne of said monocrystal semiconductor layer to a value higher than a value expressed as:

$$2K\xi(Vcc+Vo)/(q(W-d)^2),$$

wherein d is a diffusion depth of said diffusion layer.

13. A production method for a semiconductor dynamic sensor according to claim 8, wherein said impurity concentration Nb of said monocrystal semiconductor substrate is less than $2 \times 10^{18}$ atoms/cm$^3$.

14. A production method for a semiconductor dynamic sensor, comprising the steps of:

preparing a wafer in which an N-type monocrystal semiconductor layer is formed on a P-type monocrystal semiconductor substrate;

forming a P-type piezoresistance diffusion region in said N-type monocrystal semiconductor layer; and forming a distortion-causing portion of thin thickness by immersing said wafer in an etching solution so as to oppose said P-type monocrystal semiconductor substrate to an electrode provided in said etching solution, and applying a voltage between said N-type monocrystal semiconductor layer and said electrode to perform an electrochemical etching of said P-type monocrystal semiconductor substrate, said applied voltage during said electrochemical etching being adjusted to form a depletion layer which extends from a PN junction between said N-type monocrystal semiconductor layer and said P-type monocrystal semiconductor substrate into said P-type monocrystal semiconductor substrate by a thickness thicker than a thickness of a depletion layer extending from said PN junction to said P-type monocrystal semiconductor substrate at a time when a maximum rated voltage of said semiconductor dynamic sensor is applied to said N-type monocrystal semiconductor layer.

15. A production method of a semiconductor dynamic sensor according to claim 14, wherein said voltage applied during said electrochemical etching is made different by wafer, whereby plural types of semiconductor dynamic sensors which are different in thickness of said distortion-causing portion are produced.

* * * * *